US008670278B1

(12) United States Patent
Jenne et al.

(10) Patent No.: US 8,670,278 B1
(45) Date of Patent: Mar. 11, 2014

(54) METHOD AND APPARATUS FOR EXTENDING THE LIFETIME OF A NON-VOLATILE TRAPPED-CHARGE MEMORY

(75) Inventors: Fredrick B. Jenne, Sunnyvale, CA (US); Long Hinh, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 765 days.

(21) Appl. No.: 12/413,359

(22) Filed: Mar. 27, 2009

(51) Int. Cl.
*G11C 11/34* (2006.01)
*G11C 16/06* (2006.01)

(52) U.S. Cl.
USPC .................................. 365/185.2; 365/185.21

(58) Field of Classification Search
USPC ........................................ 365/185.21, 185.2
See application file for complete search history.

(56) References Cited

U.S. PATENT DOCUMENTS

| 4,608,585 | A  | * | 8/1986  | Keshtbod ...................... 257/321 |
| 6,970,383 | B1 | * | 11/2005 | Han et al. ................. 365/185.28 |
| 7,167,395 | B1 | * | 1/2007  | Kobernik et al. ........ 365/185.21 |
| 7,391,652 | B2 | * | 6/2008  | Lue ............................ 365/185.28 |
| 8,077,520 | B1 | * | 12/2011 | Yang et al. ................. 365/185.2 |

\* cited by examiner

*Primary Examiner* — Harry W Byrne
*Assistant Examiner* — Lance Reidlinger (57) ABSTRACT

Disclosed herein are a method and apparatus for extending the lifetime of a non-volatile trapped-charge memory. A method includes setting limits of a memory sense window between an intrinsic threshold voltage of a non-volatile trapped-charge memory device and one of an end-of-life (EOL) value of a threshold voltage of a programmed state of the memory device and an EOL value of a threshold voltage of an erased state of the memory device. The data state of the memory device is then sensed.

20 Claims, 12 Drawing Sheets

METHOD AND APPARATUS FOR EXTENDING THE LIFETIME OF A NON-VOLATILE TRAPPED-CHARGE MEMORY

TECHNICAL FIELD

Embodiments of the present invention relate to non-volatile, trapped-charge memory devices and, in particular, to the extension of data retention in SONOS-type memory devices.

BACKGROUND

SONOS (silicon-oxide-nitride-oxide silicon) is a semiconductor technology used in non-volatile solid-state memory devices. A SONOS device is a type of MOSFET (metal-oxide-semiconductor field effect transistor) that may use a quantum mechanical effect known as uniform, modified Fowler-Nordheim (FN) tunneling to transport charge to and from a charge-trapping dielectric layer between the control gate and the channel of the MOSFET. The trapped charge shifts the threshold voltage of the device, which is defined as the gate-to-source voltage at which the device transitions between non-conducting and conducting states. The trapped charge can be negative (electrons) or positive ("holes," the absence of electrons) and the threshold voltage of the device is shifted in opposite directions for the two opposite charge polarities. The threshold voltage shifts can be associated with two different data states or logic levels (e.g., logical "0" and logical "1"). Typically, the non-conducting state is associated with a programmed, logical "1" state and the conducting state is associated with an erased, logical "0" state. However, additional improvements are needed in the evolution of SONOS-type memory devices, e.g., in the extension of data retention in SONOS-type memory devices.

BRIEF DESCRIPTION OF THE DRAWINGS

Embodiments of the present invention are illustrated by way of example and not limitation in the figures of the accompanying drawings, in which.

DETAILED DESCRIPTION

Methods and apparatus for extending the lifetime of a non-volatile, trapped charge memory are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

In one embodiment, a method for extending the lifetime of a non-volatile trapped-charge memory includes setting the limits of a memory sense window between an intrinsic threshold voltage of a non-volatile trapped-charge memory device and one of an expected end-of-life (EOL) value of a threshold voltage of a programmed state of the memory device and an expected EOL value of a threshold voltage of an erased state of the memory device.

The data state of the SONOS device can be read by applying a known gate-to-source "trip point" voltage to the device that is less than the programmed threshold voltage and greater than the erased threshold voltage, and detecting if the device is ON (e.g., conducting) or OFF (e.g., non-conducting) by sensing the current through the device. If the current is less than some maximum specified leakage current, the device is read as OFF (e.g., programmed). If the current is greater than some minimum specified conduction current, the device is read as ON (e.g., erased). The minimum difference between the programmed and erased threshold voltages that can be reliably distinguished is defined as the "sense window." The difference between the actual threshold voltages and the sense window is defined as the "sense margin." One measure of the quality of a SONOS memory device is the magnitude of the sense margin of the device.

A SONOS device may be fabricated as an nMOS device (NSONOS) or a pMOS device (PSONOS) using complementary MOS (CMOS) fabrication techniques that are known in the art. The intrinsic threshold voltage of a SONOS device, defined as the threshold voltage of the device in the absence of any trapped charge (e.g., the charge-trapping layer is neutral, without a surplus of holes or electrons), is a function of the impurity dopant level in the channel of the device (acceptor impurities such as boron for an NSONOS device and donor impurities such as arsenic for a PSONOS device). An NSONOS device operates as an enhancement-mode MOSFET and typically has an intrinsic threshold voltage that is positive, approximately in the range of 0.4 to 0.7 volts. A PSONOS device also operates as an enhancement-mode MOSFET and typically has an intrinsic threshold voltage that is negative, approximately in the range of −0.4 to −0.7 volts.

In an embodiment, the programmed or erased state of a SONOS device is not permanent. The trapped charge slowly leaks from the charge-trapping layer via mechanisms such as trap-assisted tunneling and diffusion. Eventually, the threshold voltage of the device will return to its intrinsic threshold voltage and the stored data state is lost. Data retention is another measure of quality of a SONOS memory device, typically measured in years. The end-of-life (EOL) of a SONOS memory device is defined as the point in time when the sense margin decays to zero (e.g., where the data state of the device cannot be read without uncertainty).

Figure 1:
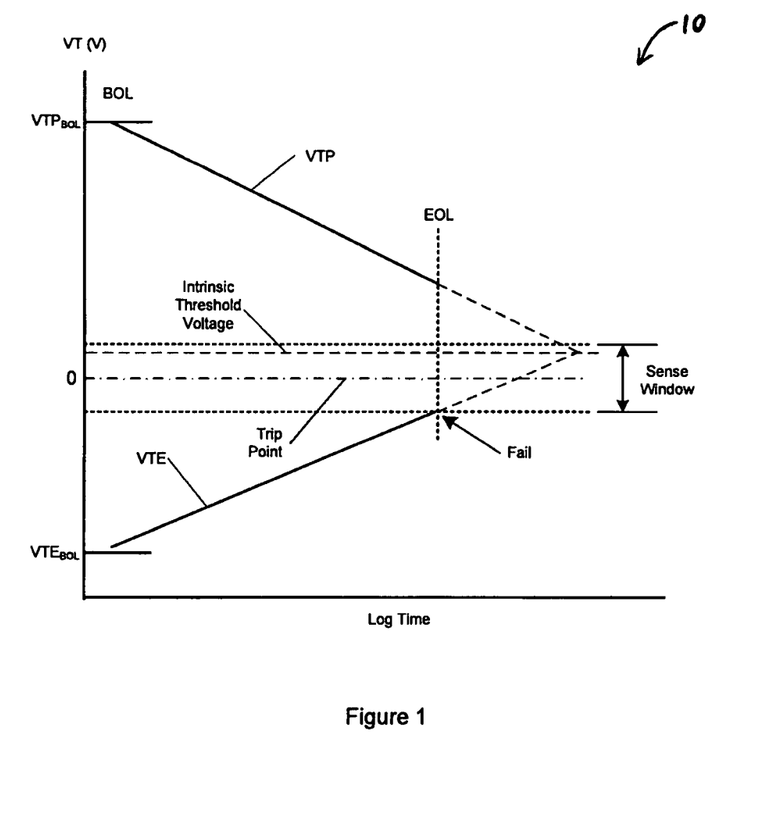
FIG. 1 illustrates the decay rates of a SONOS memory cell, in accordance with an embodiment of the present invention.

FIG. 1 illustrates a plot 10 of the threshold voltage decay rates of an NSONOS device in a programmed state and in an erased state, in accordance with an embodiment of the present invention. The programmed state has a beginning-of-life (BOL) value of $VTP_{BOL}$ and the erased state has a BOL value of $VTE_{BOL}$. As illustrated in FIG. 1, the sense margins are large at the BOL of the device. However, both threshold voltages decay towards the intrinsic threshold voltage over time. The EOL occurs when the sense margin of either the programmed state or the erased state is zero. For the device illustrated in FIG. 1, the EOL is limited by the decay of the erased threshold voltage VTE. This unsymmetrical behavior of the programmed and erased states can be attributed to several factors. First, the decay rates of holes and electrons may be different due to different carrier mobilities and effective masses. Second, the sense window is typically centered around a zero volt trip point as a design choice that simplifies control and sense circuitry in a memory array. Third, the intrinsic threshold voltage of the SONOS device is within the sense window.

Figure 2A:
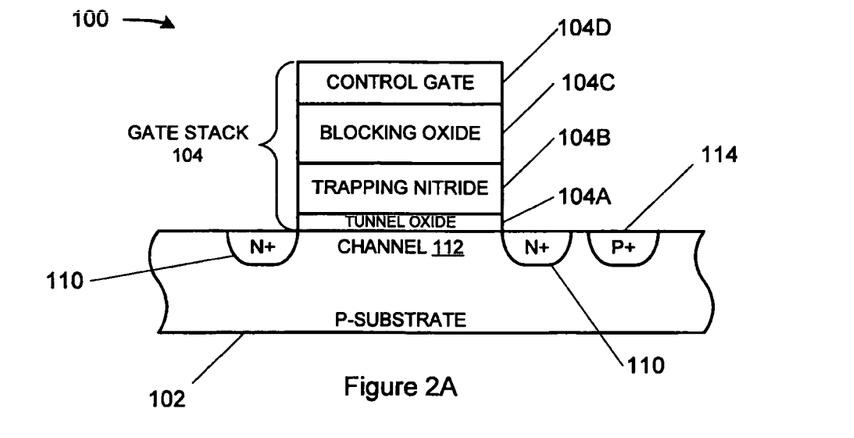
FIG. 2A illustrates an N-type SONOS device in one embodiment of the present invention.

FIG. 2A illustrates one embodiment of an N-type non-volatile trapped-charge memory device 100. Device 100 includes a gate stack 104 formed over a P-type substrate 102. Device 100 further includes N+ source and drain regions 110 in substrate 102 on either side of gate stack 104, which define a channel region 112 in substrate 102 underneath gate stack 104. Device 100 also includes a P+ ohmic contact to substrate 102. Gate stack 104 includes a tunnel dielectric layer 104A, a charge-trapping layer 104B, a top dielectric layer 104C and a gate layer 104D. Gate layer 104D is electrically isolated from substrate 102 by the intervening dielectric layers.

Device 100 may be a nonvolatile trapped-charge memory device. In accordance with one embodiment of the present invention, semiconductor device 100 is a SONOS-type device wherein the charge-trapping layer is an insulating dielectric layer having a concentration of charge-trapping sites. By convention, SONOS stands for "silicon-oxide-nitride-oxide-silicon," where the first "silicon" refers to the gate layer material, the first "oxide" refers to the top dielectric layer (also known as a blocking dielectric layer), "nitride" refers to the charge-trapping dielectric layer, the second "oxide" refers to the tunnel dielectric layer and the second "silicon" refers to the channel region. A SONOS-type device, however, is not limited to these specific materials.

Substrate 102 and, hence, channel region 112, may be a material suitable for semiconductor device fabrication. In one embodiment, substrate 102 is a bulk substrate of a single crystal of a material such as, but not limited to, silicon, germanium, silicon-germanium or a III-V compound semiconductor material. In another embodiment, substrate 102 is a bulk layer with a top epitaxial layer. In a specific embodiment, the bulk layer is a single crystal of a material such as, but not limited to, silicon, germanium, silicon-germanium, a III-V compound semiconductor material or quartz, while the top epitaxial layer is a single crystal layer such as, but not limited to, a layer of silicon, germanium, silicon-germanium or a III-V compound semiconductor material. In another embodiment, substrate 102 is a top epitaxial layer on a middle insulator layer which is above a lower bulk layer. In one embodiment, the top epitaxial layer is a single crystal layer such as, but not limited to, a layer of silicon (e.g., to form a silicon-on-insulator semiconductor substrate), germanium, silicon-germanium or a III-V compound semiconductor material. In that embodiment, the insulator layer is composed of a material such as, but not limited to, a layer of silicon dioxide, silicon nitride or silicon oxy-nitride. Also in that embodiment, the lower bulk layer is a single crystal composed of a material such as, but not limited to, silicon, germanium, silicon-germanium, a III-V compound semiconductor material or quartz. Substrate 102 and, hence, channel region 112, may include dopant impurity atoms. In a specific embodiment, channel region 112 is doped P-type and, in an alternative embodiment, channel region 112 is doped N-type.

Figure 2B:
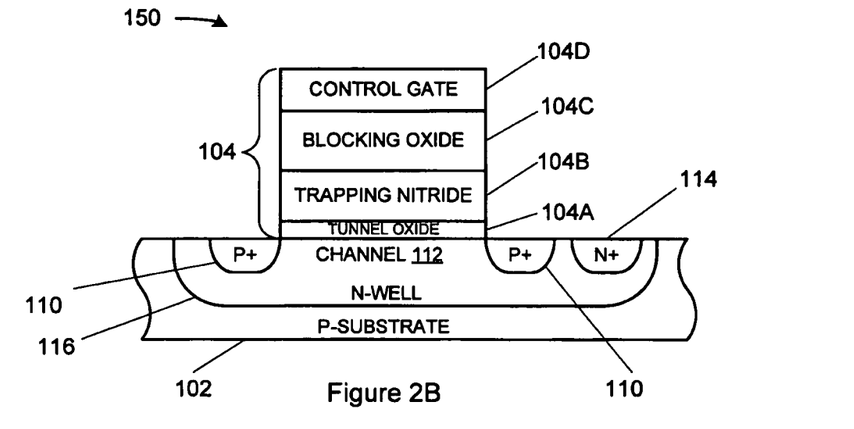
FIG. 2B illustrates a P-type SONOS device in one embodiment of the present invention.

Source and drain regions 110 in substrate 102 may be regions having opposite conductivity to channel region 112. For example, as illustrated in FIG. 2A, source and drain regions 110 are N-type doped regions while channel region 112 is a P-type doped region. In one embodiment, substrate 102 and, hence, channel region 112, is composed of boron-doped single-crystal silicon having a boron concentration approximately in the range of $10^{15}$ to $10^{19}$ atoms per $cm^3$. In that embodiment, source and drain regions 110 are composed of phosphorous-doped or arsenic-doped regions having a concentration of N-type dopants approximately in the range of $5 \times 10^{16}$ to $5 \times 10^{19}$ atoms per $cm^3$. In a specific embodiment, source and drain regions 110 have a depth in substrate 102 approximately in the range of 80 to 200 nanometers. In accordance with an alternative embodiment of the present invention, as illustrated in FIG. 2B for example, source and drain regions 110 are P-type doped regions while channel region 112 is an N-type doped region.

Tunnel dielectric layer 104A may be a material having a thickness suitable to allow charge carriers to tunnel into the charge-trapping layer under an applied gate bias. In one embodiment, tunnel dielectric layer 104A is a silicon dioxide layer or a silicon oxy-nitride layer formed by a thermal oxidation process. In another embodiment, tunnel dielectric layer 104A is formed by chemical vapor deposition or atomic layer deposition and is composed of a high dielectric constant (high-k) material such as, but not limited to, hafnium oxide, zirconium oxide, hafnium silicate, hafnium oxy-nitride, hafnium zirconium oxide or lanthanum oxide. In a specific embodiment, tunnel dielectric layer 104A has a thickness approximately in the range of 1 to 10 nanometers. In a particular embodiment, tunnel dielectric layer 104A has a thickness of approximately 2 nanometers.

Charge-trapping layer 104B may be a material having a thickness suitable to store charge and, hence, to modulate the threshold voltage of gate stack 104. In one embodiment, charge-trapping layer 104B is formed by a chemical vapor deposition process and is composed of a dielectric material such as, but not limited to, stoichiometric silicon nitride, silicon-rich silicon nitride or silicon oxy-nitride. In one embodiment, the thickness of charge-trapping layer 104B is approximately in the range of 5 to 10 nanometers.

Top dielectric layer 104C may be a material having a thickness suitable to maintain a barrier to charge leakage and tunneling under an applied gate bias. In one embodiment, top dielectric layer 104C is formed by a chemical vapor deposition process and is composed of silicon dioxide or silicon oxy-nitride. In another embodiment, top dielectric layer 104C is formed by atomic layer deposition and is composed of a high-k dielectric material such as, but not limited to, hafnium oxide, zirconium oxide, hafnium silicate, hafnium oxy-nitride, hafnium zirconium oxide or lanthanum oxide. In a specific embodiment, top dielectric layer 104C has a thickness approximately in the range of 1 to 20 nanometers.

Gate layer 104D may be a conductor or semiconductor material suitable for accommodating a bias voltage during operation of the SONOS-type device. In accordance with an embodiment of the present invention, gate layer 104D is composed of doped poly-crystalline silicon formed by a chemical vapor deposition process. In another embodiment, gate layer 104D is formed by chemical or physical vapor deposition and is composed of a metal-containing material such as, but not limited to, metal nitrides, metal carbides, metal silicides, hafnium, zirconium, titanium, tantalum, aluminum, ruthenium, palladium, platinum, cobalt or nickel.

FIG. 2B illustrates one embodiment of a P-type non-volatile trapped-charge memory device 150. As illustrated in FIG. 2B the P-type device differs from the N-type device of FIG. 2A with the addition of an N-well 116 to form a body and channel in the device and in the reversal of the conductivity type of the source and drain diffusions 110 and the contact 114 that provides an ohmic contact to the N-well 116 in the P-type device.

An N-type SONOS device may be programmed by applying a positive gate-to-body voltage $V_{PP}$ (e.g., +10 volts) for approximately 10 milliseconds and erased by applying a negative gate-to-body voltage $V_{NN}$ (e.g., –10 volts) for approximately 10 milliseconds. The programming voltage raises the threshold voltage to a value greater than the intrinsic threshold value and the erase voltage lowers the threshold voltage to a value below the intrinsic threshold voltage.

Figure 3A:
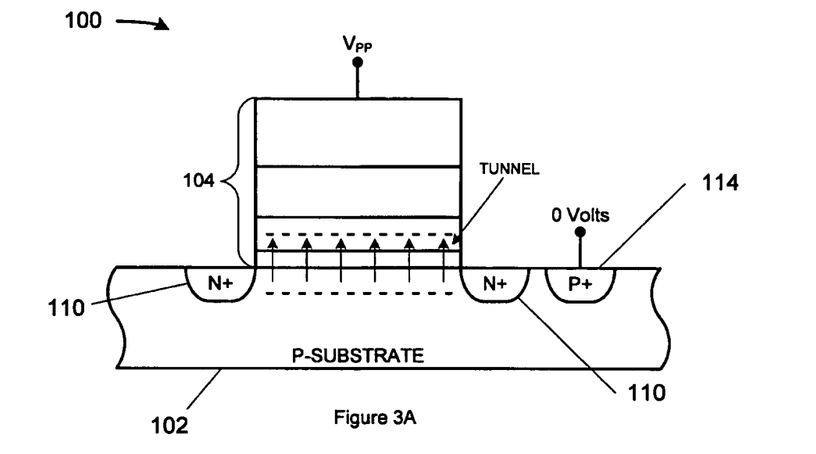
FIGS. 3A and 3B illustrate programming a SONOS device in one embodiment of the present invention.
Figure 3B:
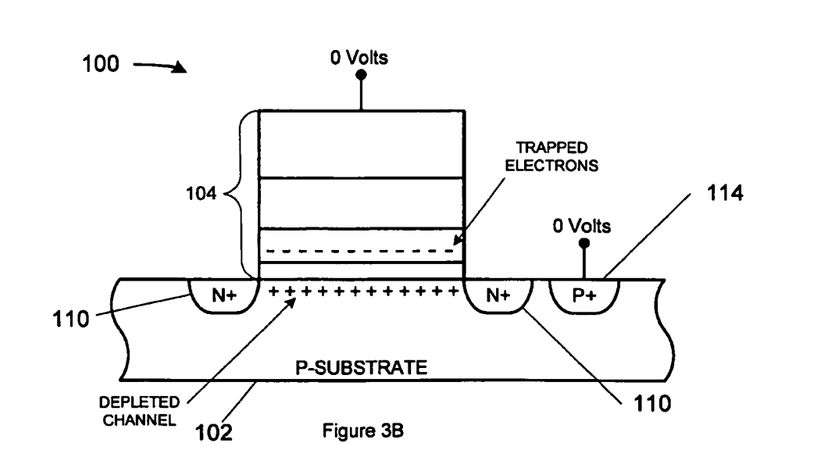
Figure 3C:
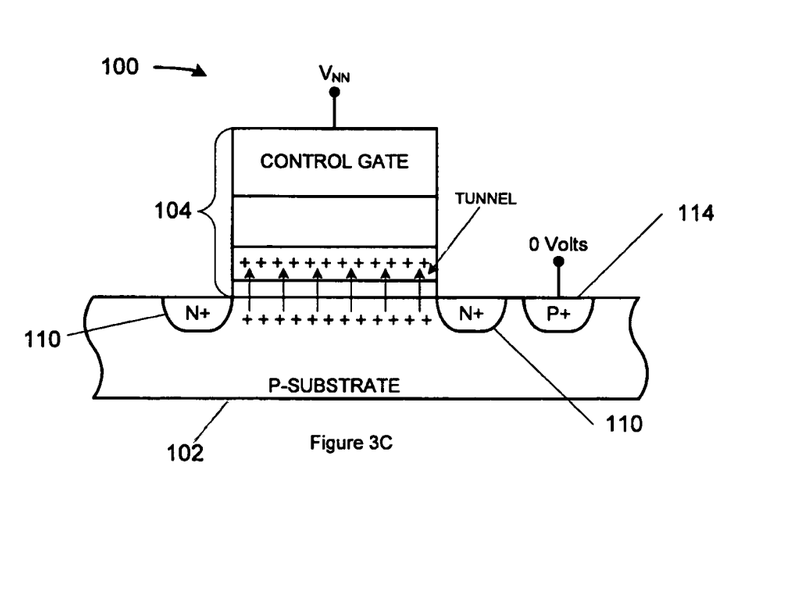
FIGS. 3C and 3D illustrate erasing a SONOS device in one embodiment of the present invention.
Figure 3D:
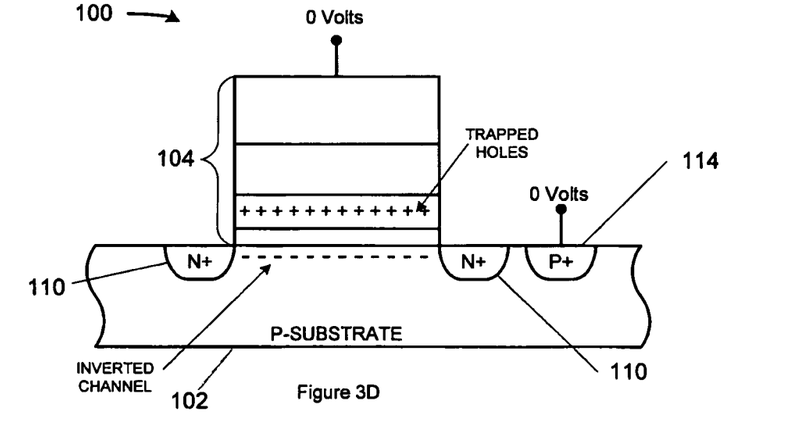

FIG. 3A illustrates how an NSONOS device is programmed. The programming voltage $V_{PP}$ creates an electric field that causes electrons to tunnel from the channel 112 through the tunnel oxide layer 104A to the nitride layer 104B (all of which are shown in FIG. 2A), where they become trapped. When the programming voltage is removed, as illustrated in FIG. 3B, the trapped electrons in the nitride layer 104B repel free electrons from the channel 112, depleting the channel of electrons and leaving a positive space charge. The positive space charge forms PN junctions with the N+ source and drain diffusions 110 and prevents conduction between the drain and source. The threshold voltage increases because a larger positive voltage is used to overcome the effect of the trapped electrons on the channel. FIG. 3C illustrates how an N-type SONOS device is erased. The erase voltage $V_{NN}$ creates an electric field that causes holes to tunnel from the channel 112 through the tunnel oxide layer 104A to the nitride layer 104B (all of which are shown in FIG. 2A), where they become trapped. When the erase voltage is removed, as illustrated in FIG. 2D, the trapped holes in the nitride layer 104B attract free electrons to the channel 112, inverting the channel. The inverted channel allows conduction between the source and drain. In an embodiment, a negative gate-to-source voltage is used to repel electrons from the channel to turn the device off. This negative voltage is the threshold voltage of the erased device.

It will be appreciated that the operation of a P-type SONOS (PSONOS) device is similar to that of the N-type SONOS (NSONOS) device described above, except that the programming and erase voltages are reversed and the roles of holes and electrons are reversed. The PSONOS device is programmed by applying the negative gate-to-body voltage $V_{NN}$ for approximately 10 milliseconds and is erased by applying the positive gate-to-body voltage $V_{PP}$ for approximately 10 milliseconds. The programming voltage lowers the threshold voltage to a value less than the intrinsic threshold and the erase voltage raises the threshold voltage to a value above the intrinsic threshold.

As noted above, in an embodiment, the intrinsic threshold voltage of an NSONOS device is positive. As a result, the NSONOS device is an enhancement mode FET that is normally OFF when the applied gate-to-source voltage is less positive than the intrinsic threshold voltage. In an embodiment, the intrinsic threshold voltage of a PSONOS device is negative. As a result, the PSONOS device is an enhancement mode FET that is normally OFF when the applied gate-to-source voltage is less negative than the intrinsic threshold voltage.

Figure 4A:
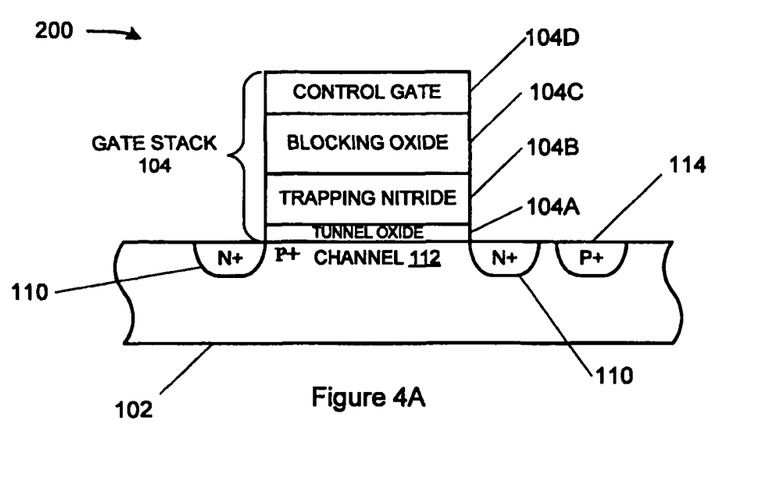
FIG. 4A illustrates an NSONOS device with a P+ channel in one embodiment of the present invention.
Figure 4B:
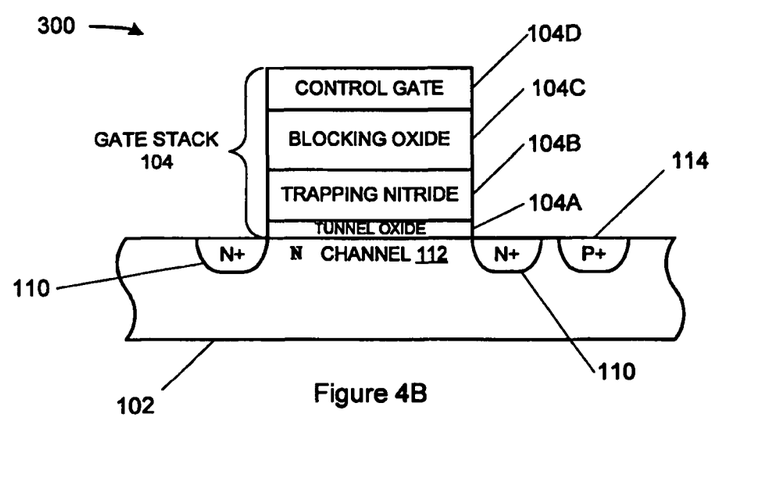
FIG. 4B illustrates a depletion mode NSONOS device in one embodiment of the present invention.

However, in certain embodiments of the present invention, the intrinsic threshold voltage of a SONOS-type device is modified by altering the impurity doping levels in the channel during fabrication. In one embodiment, as illustrated in FIG. 4A, the intrinsic threshold voltage of an NSONOS device 200 is increased (e.g., made more positive) by increasing the concentration of acceptor impurities (e.g., boron) in the channel region such that the channel 112 has a P+ impurity concentration. In one embodiment, as illustrated in FIG. 4B, the intrinsic threshold voltage of an NSONOS device 300 is made negative by doping the channel region 112 with donor impurities (e.g., arsenic or phosphorous) such that the channel 112 is N-type and the NSONOS device operates as a depletion mode FET that is normally ON when the applied gate-to-source voltage is less negative than the intrinsic threshold voltage.

Figure 4C:
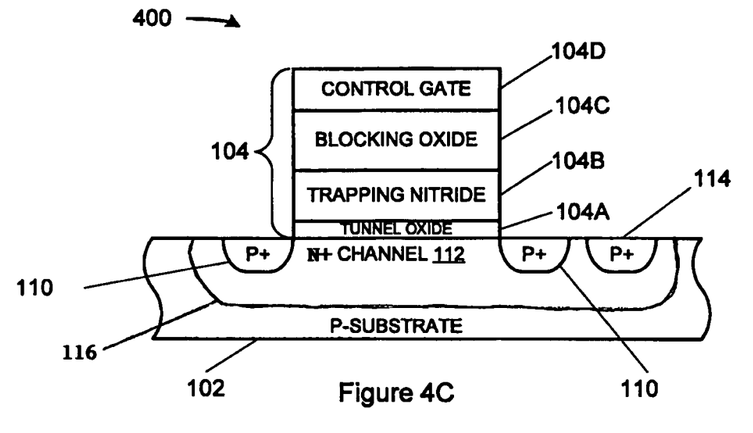
FIG. 4C illustrates a PSONOS device with an N+ channel in one embodiment of the present invention.
Figure 4D:
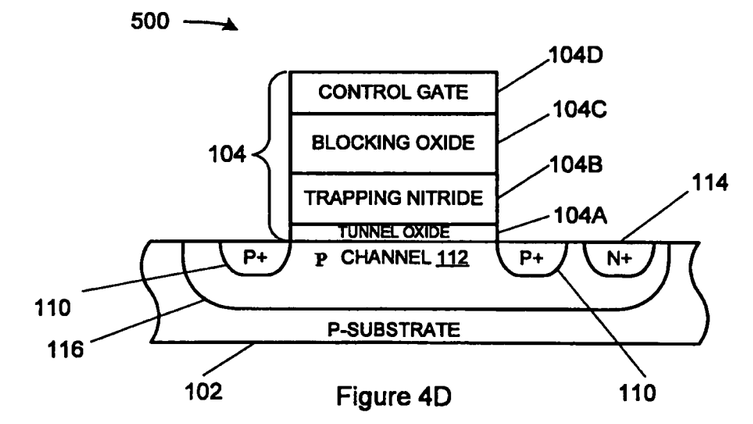
FIG. 4D illustrates a depletion mode PSONOS device in one embodiment of the present invention.

In one embodiment, as illustrated in FIG. 4C, the intrinsic threshold voltage of a PSONOS device is decreased (e.g., made more negative) by increasing the concentration of donor impurities (e.g., arsenic or phosphorous) in the channel region such that the channel 112 has an N+ impurity concentration. In one embodiment, as illustrated in FIG. 4D, the intrinsic threshold voltage of a PSONOS device is made positive by doping the channel region 112 with acceptor impurities (e.g., boron) such that the channel is P-type and the PSONOS device operates as an enhancement mode FET that is normally ON when the applied gate-to-source voltage is less positive than the intrinsic threshold voltage.

Semiconductor manufacturing processes, such as CMOS manufacturing processes used for the fabrication of SONOS-type devices, rely on tightly controlled processing variables. However, even the tightest controls cannot eliminate all process variations. As a result, in an embodiment, the characteristics of devices across a semiconductor wafer are characterized as statistical averages or expected values having standard deviations that reflect the level of control on all of the processing variables (e.g., time, temperature, flow rates, vapor-phase concentrations, etc.)

Figure 5A:
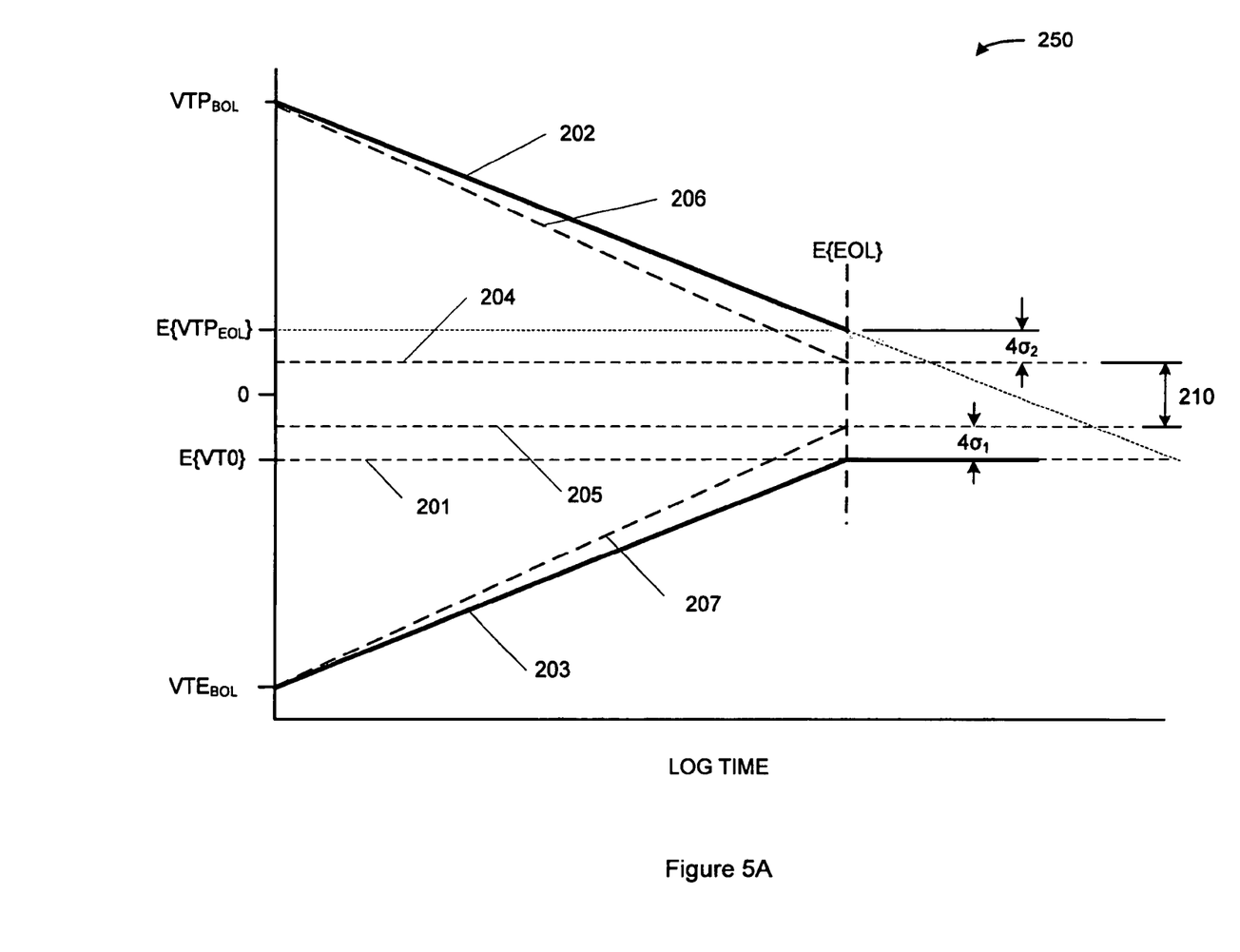
FIG. 5A illustrates data retention of the NSONOS device of FIG. 4A in one embodiment of the present invention.

FIG. 5A is a graph 250 illustrating data retention of NSONOS device 200 having a negative intrinsic threshold voltage 201 as described above with an expected value $E\{VT0\}$ and a standard deviation $\sigma_1$. NSONOS device 200 has a programmed threshold voltage 202 with an expected BOL value of $E\{VTP_{BOL}\}$ and an expected EOL value of $E\{VTP_{EOL}\}$ with a standard deviation $\sigma_2$. NSONOS device 200 has an erased threshold voltage 203 with an expected BOL value $E\{VTE_{BOL}\}$ and with an EOL value equal to $E\{VT0\}$. That is, in an embodiment, the EOL value of the erased threshold voltage is the expected value of the intrinsic threshold voltage $E\{VT0\}$ because the erased threshold voltage cannot decay to a value above the intrinsic threshold voltage. A sense window 210 may be defined with an upper limit 204 that is at least four $\sigma_2$ below the expected EOL value of the programmed threshold voltage 202. The sense window may also be defined with a lower limit 205 that is at least four $\sigma_1$ above the expected value of the intrinsic threshold voltage 201. It is well-known that the probability that a statistical variable will deviate from its expected value by more than four standard deviations is 0.003%. Therefore, in an embodiment, there is at most a 0.003% probability that device 200 will have a data retention EOL less than $E\{EOL\}$ defined at one limit by the intersection of a worst case (4σ2) programmed threshold voltage decay rate 206 with the upper limit 204 of the sense window 210, and at another limit by the intersection of a worst case (4σ1) erased threshold voltage decay rate 207 with the lower limit 205 of the sense window 210.

Figure 5B:
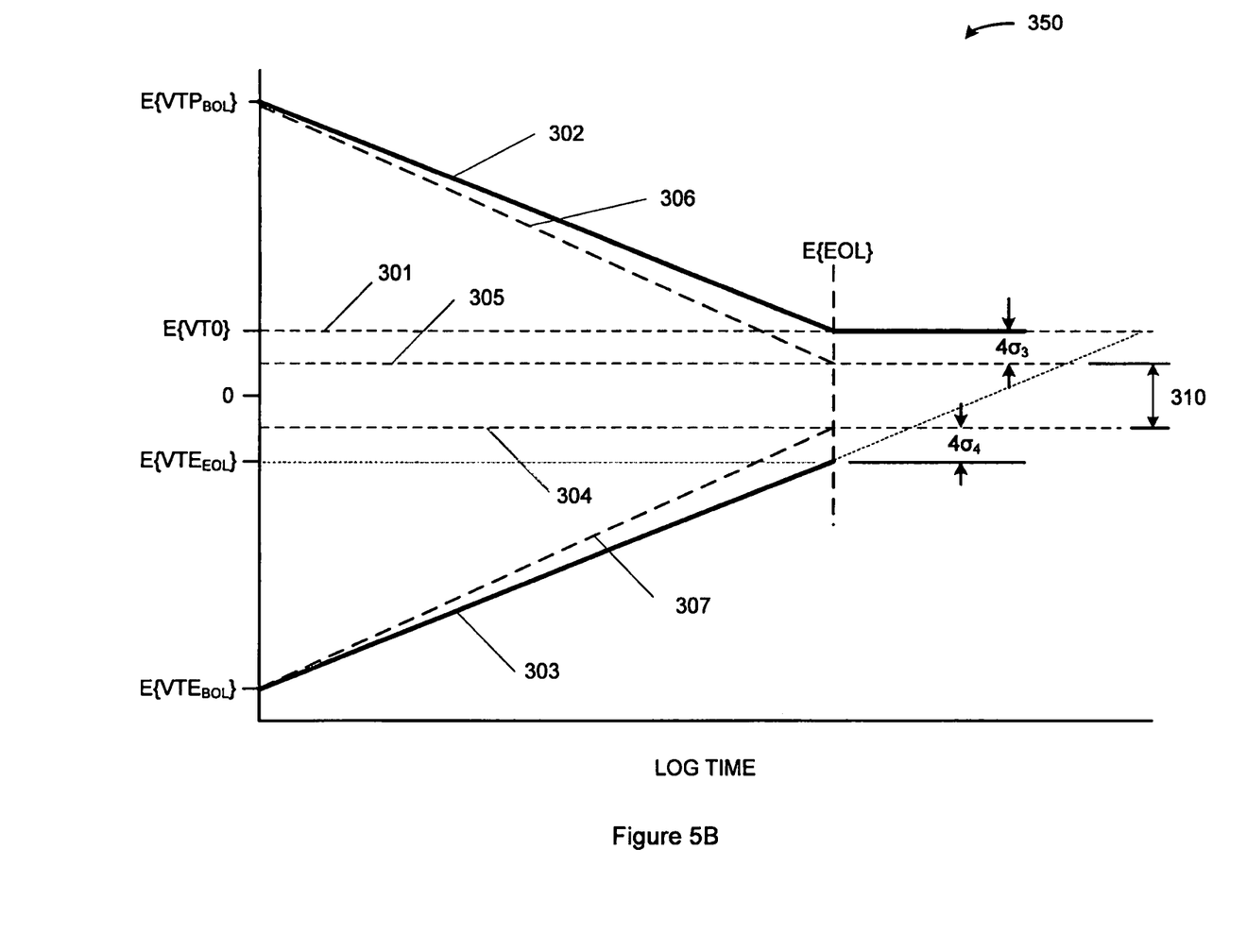
FIG. 5B illustrates data retention of the NSONOS device of FIG. 4B in one embodiment of the present invention.

FIG. 5B is a graph 350 illustrating data retention of NSONOS device 300 having a positive intrinsic threshold voltage 301 as described above with an expected value E{VT0} and a standard deviation $\sigma_3$. NSONOS device 300 has a programmed threshold voltage 302 with an expected BOL value of E{VTP$_{BOL}$} and an EOL value equal to E{VT0}. NSONOS device 300 has an erased threshold voltage 303 with an expected BOL value E{VTE$_{BOL}$} and with an expected EOL value equal to E{VT0} with a standard deviation $\sigma_3$. That is, in an embodiment, the EOL value of the programmed threshold voltage is the expected value of the intrinsic threshold voltage E{VT0} because the programmed threshold voltage cannot decay to a value below the intrinsic threshold voltage. A sense window 310 may be defined with a lower limit 304 that is at least four $\sigma_4$ below the expected EOL value of the erased threshold voltage 303. The sense window may also be defined with an upper limit 305 that is at least four $\sigma_3$ above the expected value of the intrinsic threshold voltage 301. As noted above, in an embodiment, by the definition of standard deviation, there is at most a 0.003% probability that device 230 will have a data retention EOL less than E{EOL} defined at one limit by the intersection of a worst case (4$\sigma_2$) programmed threshold voltage decay rate 306 with the upper limit 305 of the sense window 310, and at another limit by the intersection of a worst case (4$\sigma_4$) erased threshold voltage decay rate 307 with the lower limit 304 of the sense window 310.

Figure 5C:
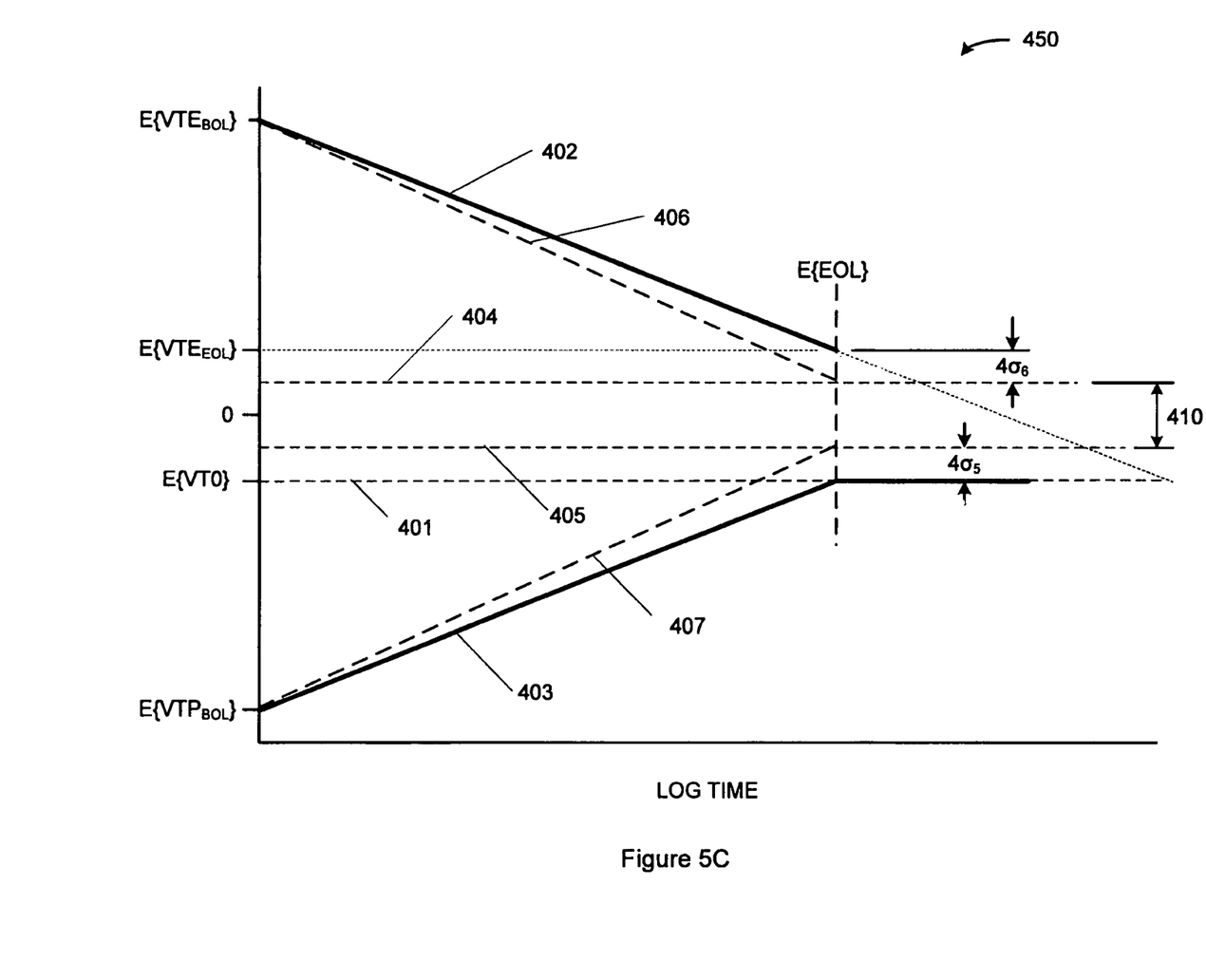
FIG. 5C illustrates data retention of the PSONOS device of FIG. 4C in one embodiment of the present invention.

FIG. 5C is a graph 450 illustrating data retention of PSONOS device 400 having a negative intrinsic threshold voltage 401 as described above with an expected value E{VT0} and a standard deviation $\sigma_5$. PSONOS device 400 has an erased threshold voltage 402 with an expected BOL value of E{VTE$_{BOL}$} and an expected EOL value of E{VTE$_{EOL}$} with a standard deviation $\sigma_6$. PSONOS device 400 has a programmed threshold voltage 403 with an expected BOL value E{VTP$_{BOL}$} and with an EOL value equal to E{VT0}. That is, in an embodiment, the EOL value of the programmed threshold voltage is the expected value of the intrinsic threshold voltage E{VT0} because the programmed threshold voltage cannot decay to a value above the intrinsic threshold voltage. A sense window 410 may be defined with an upper limit 404 that is at least four $\sigma_6$ below the expected EOL value of the programmed threshold voltage 402. The sense window may also be defined with a lower limit 405 that is at least four $\sigma_5$ above the expected value of the intrinsic threshold voltage 401. As noted above, in an embodiment, there is at most a 0.003% probability that device 400 will have a data retention EOL less than E{EOL} defined at one limit by the intersection of a worst case (4$\sigma_6$) erased threshold voltage decay rate 406 with the upper limit 404 of the sense window 410, and at another limit by the intersection of a worst case (4$\sigma_5$) programmed threshold voltage decay rate 407 with the lower limit 405 of the sense window 410.

Figure 5D:
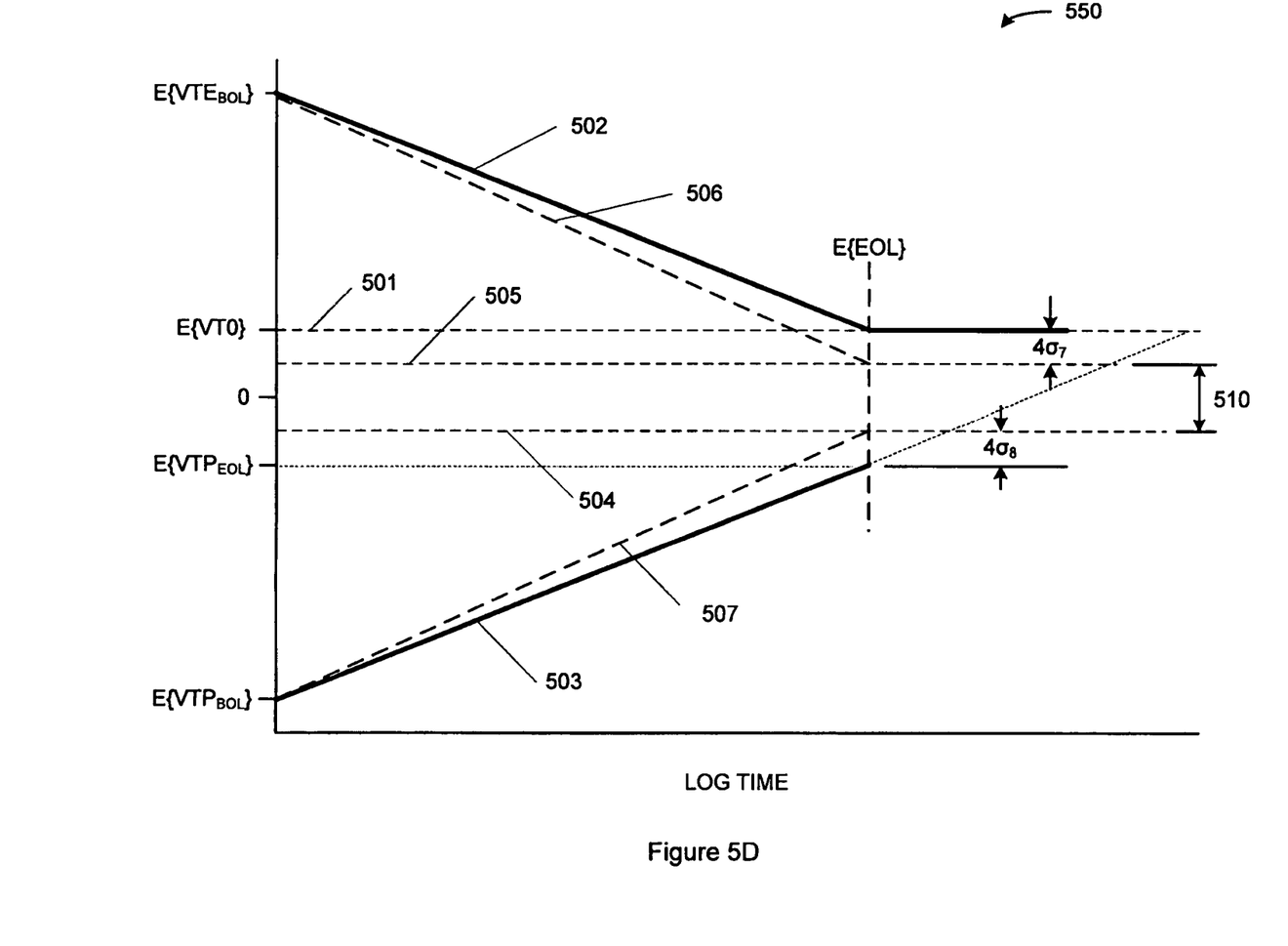
FIG. 5D illustrates data retention of the PSONOS device of FIG. 4D in one embodiment of the present invention.

FIG. 5D is a graph 550 illustrating data retention of PSONOS device 500 having a positive intrinsic threshold voltage 501 as described above with an expected value E{VT0} and a standard deviation $\sigma_7$. PSONOS device 500 has a programmed threshold voltage 503 with an expected BOL value of E{VTP$_{BOL}$} and an expected EOL value equal to E{VTP$_{EOL}$} with a standard deviation $\sigma_8$. PSONOS device 500 has an erased threshold voltage 502 with an expected BOL value E{VTE$_{BOL}$} and with an expected EOL value equal to E{VT0} with standard deviation $\sigma_7$. That is, in an embodiment, the EOL value of the erased threshold voltage is the expected value of the intrinsic threshold voltage E{VT0} because the programmed threshold voltage cannot decay to a value below the intrinsic threshold voltage. A sense window 510 may be defined with a lower limit 504 that is at least four $\sigma_8$ above the expected EOL value of the erased threshold voltage 503. The sense window may also be defined with an upper limit 505 that is at least four $\sigma_7$ below the expected value of the intrinsic threshold voltage 501. As noted above, in an embodiment, by the definition of standard deviation, there is at most a 0.003% probability that device 500 will have a data retention EOL less than E{EOL} defined at one limit by the intersection of a worst case (4$\sigma_8$) programmed threshold voltage decay rate 507 with the lower limit 504 of the sense window 510, and at another limit by the intersection of a worst case (4$\sigma_7$) erased threshold voltage decay rate 506 with the upper limit 505 of the sense window 510.

Figure 6:
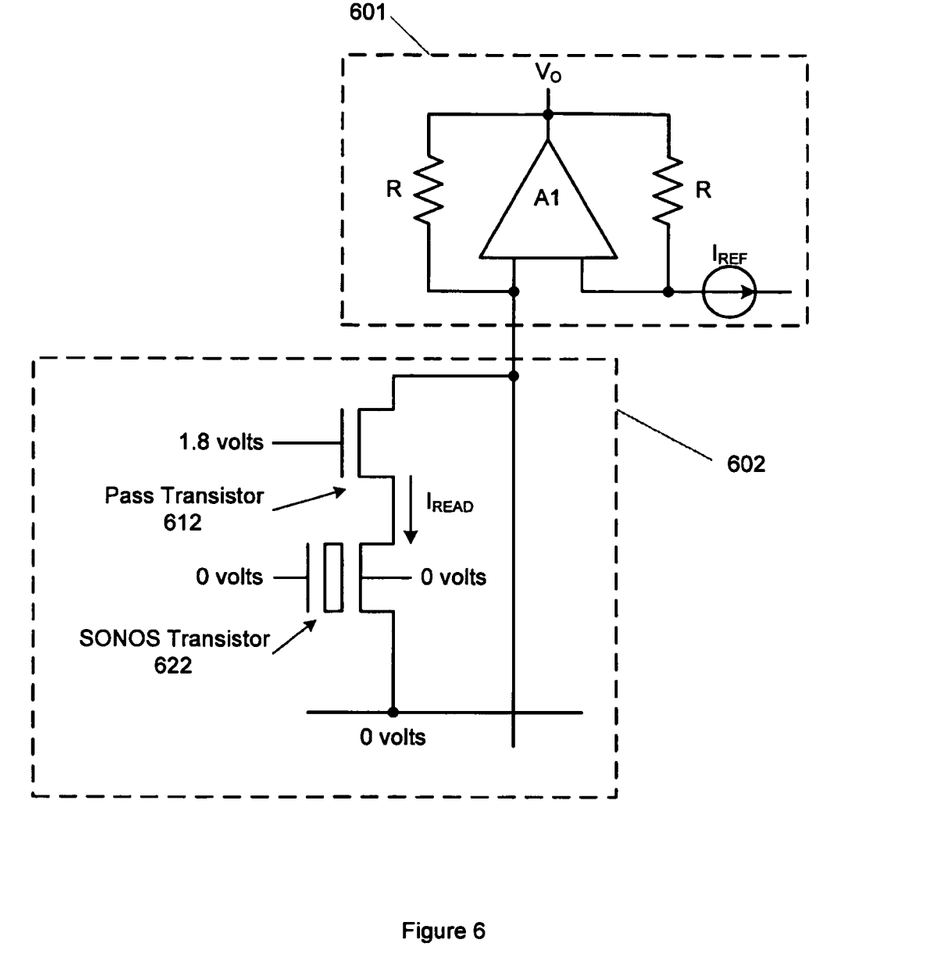
FIG. 6 illustrates a memory cell and sense circuitry according to one embodiment of the present invention.

With sense windows 210, 310, 410 and 510 associated with devices 200, 300, 400 and 500, respectively, a sense amplifier may be defined to reliably read (e.g., with probability of error less than approximately 0.003%) the data state of any of devices 200, 300, 400, and 500. FIG. 6 illustrates one embodiment of a sense circuit 601 coupled with a two transistor (2T) memory cell 602 including a SONOS-type device 622 (which may be any of devices 200, 300, 400 and 500) coupled with a pass transistor 612. In one embodiment, sense circuit 601 includes a high-gain differential amplifier A1, a pair of matched resistors R and a reference current source $I_{REF}$. In one embodiment, $I_{REF}$ is selected to be a current approximately equal to a minimum read current corresponding to an ON state of SONOS transistor 622. In an embodiment, if the current through SONOS transistor 622 is greater than or equal to $I_{REF}$, then V0 will be approximately zero. In an embodiment, if SONOS transistor 622 is in an OFF state (e.g., programmed), then $I_{READ}$ will be less than $I_{REF}$ and V0 will be forced to a rail voltage indicating the state of SONOS device 622.

Figure 7:
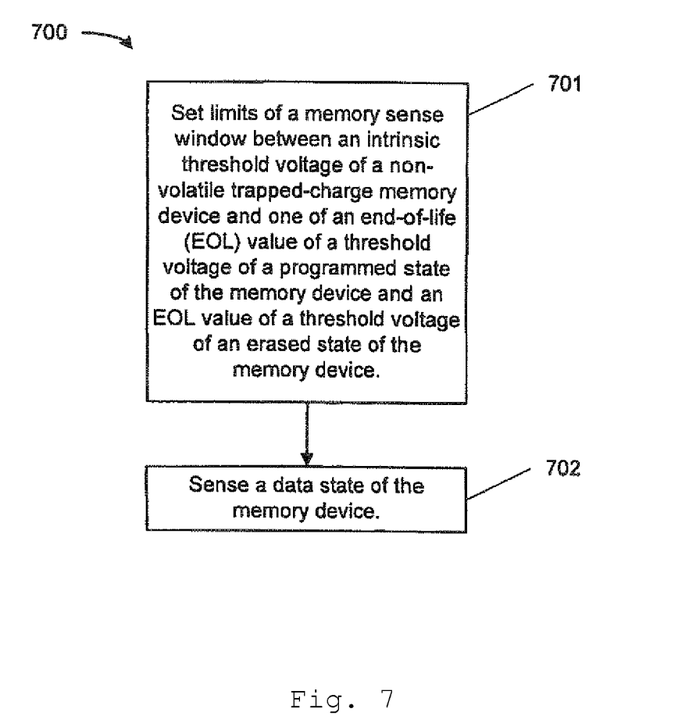
FIG. 7 is a flowchart illustrating operations in a method for extending the data retention of a SONOS device, according to one embodiment of the present invention.

FIG. 7 is a flowchart 700 illustrating operations in a method for extending the lifetime of a non-volatile, trapped-charge memory device, in accordance with an embodiment of the present invention. As illustrated in FIG. 7, a method begins with setting the limits of a memory sense window between an intrinsic threshold voltage of a non-volatile trapped-charge memory device and one of an end-of-life (EOL) value of a threshold voltage of a programmed state of the memory device and an EOL value of a threshold voltage of an erased state of the memory device (operation 701). In an embodiment, the method further includes sensing a data state of the memory device (operation 702).

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
    setting limits of a memory sense window, wherein the memory sense window is between an expected intrinsic threshold voltage (E{VT0}) of a non-volatile trapped-charge memory device and one of a beginning-of-life (BOL) value of a threshold voltage of a programmed state of the non-volatile trapped-charge memory device (VTP$_{BOL}$) and a BOL value of a threshold voltage of an erased state of the non-volatile trapped-charge memory device (VTE$_{BOL}$), and wherein setting the limits of the memory sense window comprises determining a standard deviation for the E{VTO} and setting an upper or a lower limit of the memory sense window within four standard deviations of E{VTO} from E{VTO}; and sensing, using a sense circuit, a data state of the non-volatile trapped-charge memory device.

2. The method of claim 1, wherein the non-volatile trapped-charge memory device comprises an N-type SONOS-type memory device.

3. The method of claim 2 further comprising setting the expected intrinsic threshold voltage E{VTO} by altering concentration of acceptor impurities in a channel region of the N-type SONOS-type memory device such that the channel region has a P+ impurity concentration.

4. The method of claim 1, wherein the non-volatile trapped-charge memory device comprises a P-type SONOS-type memory device.

5. The method of claim 4 further comprising setting the expected intrinsic threshold voltage E{VTO} by altering concentration of donor impurities in a channel region of the P-type SONOS-type memory device such that the channel region has an N+ impurity concentration.

6. The method of claim 1, wherein setting the limits of the memory sense window comprises setting the lower limit of the memory sense window at four standard deviations above E{VTO}.

7. The method of claim 6, wherein the non-volatile trapped-charge memory device comprises an expected erased threshold voltage decay rate, an expected programmed threshold voltage decay rate, and an expected end-of-life (E{EOL}) defined as a time which it takes $VTE_{BOL}$ to decay to E{VTO}, and further comprising:

defining an expected programmed threshold voltage end-of-life (E{$VTP_{EOL}$}) as a voltage to which $VTP_{BOL}$ has decayed at the time of E{EOL}; and setting the upper limit of the memory sense window at four standard deviations of E{$VTP_{EOL}$} below E{$VTP_{EOL}$}.

8. The method of claim 1, wherein setting the limits of the memory sense window comprises setting the upper limit of the memory sense window at four standard deviations below E{VTO}.

9. The method of claim 8, wherein the non-volatile trapped-charge memory device comprises an expected erased threshold voltage decay rate, an expected programmed threshold voltage decay rate, and an expected end-of-life (E{EOL}) defined as a time which it takes $VTP_{BOL}$ to decay to E{VTO}, and further comprising:

defining an expected erased threshold voltage end-of-life (E {$VTE_{EOL}$}) as a voltage to which $VTE_{BOL}$ has decayed at the time of E {EOL}; and setting the lower limit of the memory sense window at four standard deviations of E {$VTE_{EOL}$} above E {$VTE_{EOL}$}.

10. An apparatus, comprising:

a non-volatile trapped-charge memory device having a sense window between an expected intrinsic threshold voltage (E{VTO}) and a beginning-of-life (BOL) threshold voltage corresponding to one of an erased state of the non-volatile trapped-charge memory device, ($VTE_{BOL}$), and a programmed state of the non-volatile trapped-charge memory device, ($VTP_{BOL}$), wherein the sense window is defined by an upper and a lower limit, and wherein one of the upper or the lower limit of the sense window is within four standard deviations of E{VTO} from E{VTO}; and a sense amplifier, coupled to the non-volatile trapped-charge memory device, to read a memory state of the non-volatile trapped-charge memory device and compare the memory state of the non-volatile trapped-charge memory device with a reference state.

11. The apparatus of claim 10, wherein the upper limit of the memory sense window is set at four standard deviations of E{VTO} below E{VTO}, and further comprising an expected programmed threshold voltage decay rate, and an expected end-of-life (E{EOL}) defined as a time which it takes $VTP_{BOL}$ to decay to E{VTO}.

12. The apparatus of claim 11, further comprising an expected erased threshold voltage end-of-life (E{$VTE_{EOL}$}) defined as a voltage to which $VTE_{BOL}$ has decayed at the time of E{EOL}, and wherein the lower limit of the memory sense window is set at four standard deviations of E{$VTE_{EOL}$} above E{$VTE_{EOL}$}.

13. The apparatus of claim 10 wherein the lower limit of the memory sense window is set at four standard deviations of E{VTO} above E{VTO}, and further comprising an expected erased threshold voltage decay rate, and an expected end-of-life (E{EOL}) defined as a time which it takes $VTE_{BOL}$ to decay to E{VTO}.

14. The apparatus of claim 13, further comprising an expected programmed threshold voltage end-of-life (E{$VTP_{EOL}$}) defined as a voltage to which $VTP_{BOL}$ has decayed at the time of E{EOL}, and wherein the upper limit of the memory sense window is set at four standard deviations of E{$VTP_{EOL}$} above E{$VTP_{EOL}$}.

15. A method comprising:

setting a trip point voltage between a beginning-of-life (BOL) programmed threshold voltage ($VTP_{BOL}$) and a BOL erased threshold voltage ($VTE_{BOL}$) of a non-volatile trapped-charge memory device;

setting an expected intrinsic threshold voltage (E{VTO}) of the non-volatile trapped-charge memory device between the trip point voltage and one of $VTP_{BOL}$ and $VTE_{BOL}$; and setting limits of a sense window around the trip point voltage, wherein setting the limits of the sense window comprises determining a standard deviation for the E{VTO} and setting an upper or a lower limit of the sense window within four standard deviations of E{VTO} from E{VTO}.

16. The method of claim 15, wherein the sense window is centered on the trip point voltage.

17. The method of claim 15, wherein setting the limits of the memory sense window comprises setting the lower limit of the memory sense window at four standard deviations above E {VTO}.

18. The method of claim 17, wherein the non-volatile trapped-charge memory device comprises an expected erased threshold voltage decay rate, an expected programmed threshold voltage decay rate, and an expected end-of-life (E{EOL}) defined as a time which it takes $VTE_{BOL}$ to decay to E{VTO}, and further comprising:

defining an expected programmed threshold voltage end-of-life (E {$VTP_{EOL}$}) as a voltage to which $VTP_{BOL}$ has decayed at the time of E {EOL}; and setting the upper limit of the memory sense window at four standard deviations of E {$VTP_{EOL}$} below E {$VTP_{EOL}$}.

19. The method of claim 15, wherein setting the limits of the memory sense window comprises setting the upper limit of the memory sense window at four standard deviations below E {VTO}.

20. The method of claim 19, wherein the non-volatile trapped-charge memory device comprises an expected erased threshold voltage decay rate, an expected programmed threshold voltage decay rate, and an expected end-of-life (E{EOL}) defined as a time which it takes $VTP_{BOL}$ to decay to E{VTO}.

* * * * *